(12) United States Patent
Reining et al.

(10) Patent No.: US 6,359,449 B1
(45) Date of Patent: Mar. 19, 2002

(54) SINGLE COIL CONDUCTANCE MEASURING APPARATUS

(75) Inventors: William N. Reining, Madison; Marshall J. Bell, Stoughton, both of WI (US)

(73) Assignee: Intellectual Property LLC, Cross Plains, WI (US)

( * ) Notice: Subject to any disclaimer, the term of this patent is extended or adjusted under 35 U.S.C. 154(b) by 0 days.

(21) Appl. No.: 09/343,166

(22) Filed: Jun. 29, 1999

(51) Int. Cl.[7] ............................................. G01R 27/08
(52) U.S. Cl. ..................................................... 324/692
(58) Field of Search ............................... 324/445, 248, 324/117 R, 633, 634, 635, 652, 691, 692, 707, 708; 331/8, 11, 14, 137; 600/484, 481, 534, 538

(56) References Cited

U.S. PATENT DOCUMENTS

| | | | |
|---|---|---|---|
| 2,542,057 A | 2/1951 | Relis | 175/183 |
| 3,609,580 A | 9/1971 | Thompson et al. | 331/65 |
| 3,806,798 A | 4/1974 | Gross | 324/30 |
| 3,855,522 A | 12/1974 | Kobayashi | 324/30 |
| 3,867,688 A | 2/1975 | Koski | 324/30 |
| 3,891,916 A | 6/1975 | Meador et al. | 324/6 |
| 3,980,076 A | 9/1976 | Wikswo, Jr. et al. | 128/2.05 |
| 3,989,009 A | 11/1976 | Robar et al. | 119/14.08 |
| 4,146,834 A | 3/1979 | Maltby et al. | 324/60 |
| 4,220,920 A | 9/1980 | Gross | 324/442 |
| 4,308,872 A * | 1/1982 | Watson et al. | 128/725 |
| 4,324,255 A | 4/1982 | Barach et al. | 128/630 |
| 4,348,984 A | 9/1982 | Brayer | 119/14.08 |
| 4,446,427 A | 5/1984 | Lovrenich | 324/207 |
| 4,494,553 A | 1/1985 | Sciarra et al. | 128/721 |
| 4,740,755 A | 4/1988 | Ogawa | 324/445 |
| 4,825,168 A | 4/1989 | Ogawa et al. | 324/439 |
| 4,919,640 A | 4/1990 | Yanagibori | 455/164 |
| 5,077,525 A | 12/1991 | West et al. | 324/445 |
| 5,131,399 A * | 7/1992 | Sciarra | 128/671 |
| 5,157,332 A | 10/1992 | Reese | 324/445 |
| 5,237,606 A | 8/1993 | Ziermann | 379/413 |
| 5,331,968 A | 7/1994 | Williams | 128/721 |
| 5,339,037 A | 8/1994 | Bonner et al. | 324/366 |
| 5,610,560 A * | 3/1997 | Sauer et al. | 331/8 |
| 5,686,841 A * | 11/1997 | Stolarczyk et al. | 324/635 |

* cited by examiner

*Primary Examiner*—Safet Metjahic
*Assistant Examiner*—Etienne P LeRoux
(74) *Attorney, Agent, or Firm*—Quarles & Brady LLP

(57) ABSTRACT

A conductance sensor uses a high impedance feedback oscillator to drive a single coil at the natural resonant frequency of the coil coupled to a measured material. The amplitude of the driving signal is also feedback controlled. The error signal of the amplitude control yields a measurement of resistance of the measured material. The combination of frequency adjustment and amplitude control eliminates non-resistance impedance effects and amplitude-dependent effects allowing high precision, high sensitivity measurement.

12 Claims, 2 Drawing Sheets

SINGLE COIL CONDUCTANCE MEASURING APPARATUS

CROSS-REFERENCE TO RELATED APPLICATION

This application claims the benefit of U.S. patent application Ser. No. 08/724,388, filed on Oct. 1, 1996.

FIELD OF THE INVENTION

The present invention relates to a sensor for measuring conductance of material and in particular a sensor that may be used, among other applications, for measuring periodic respiratory and cardiac motion by detecting changes the in conductance of patient tissue.

BACKGROUND OF THE INVENTION

Conductance Measurement

The conductance of a material, that is, how well it conducts electricity, may be determined by applying a voltage to the material with a pair of electrodes and measuring the corresponding current flow.

This approach, while straightforward, has several disadvantages. First, it is sensitive to localized high resistances at the interface between the electrodes and the material. Second, the electrodes used to apply the voltage must contact the material raising issues of contamination of the materials and corrosion of the electrodes.

For this reason it is known to make non-contacting measurement of conductivity using a pair of electrical coils immersed in the material being measured. The premise behind such systems is that electrical coupling of an alternating current signal between the two coils is functionally related to the conductivity of the material between the coils. Such systems have the disadvantage of requiring multiple coils.

A single coil resistivity measuring system (resistivity being the inverse of conductivity) is described in U.S. Pat. No. 4,536,713. In this system, eddy currents are induced in a drilling fluid for an oil well or the like by a magnetic field applied via a ferrite core. The measured eddy currents, as reflected on the driving voltage of the coil, provide a coarse indication of drilling liquid resistivity.

Respiration Monitoring

Electronic monitoring of respiration may be performed for critically ill or comatose patients, small children at risk of sudden infant death ("SID"), or patients with sleep apneas (partial suspension of breathing sometimes associated with insomnia).

There are two types of sleep apnea. Obstructive apnea, is caused by blockage of the windpipe or mouth and nose, and is characterized by a change in the phase relationship between respiratory movement of the chest and abdomen. In central apnea, the patient ceases all signs of breathing.

Distinguishing central apnea from obstructive apnea requires independent detection of abdominal and thoracic respiratory motion.

A number of different types of respiration sensors are known in the art, including mechanical sensors employing air flow measuring turbines or the like, that require the use of a face mask or mouthpiece, and inflatable cuffs which measure chest or abdomen extension manifest as a change in cuff pressure. Such mechanical systems can suffer from problems of reliability.

Respiratory motion may be also detected electronically by conductive coils wrapped around the patient. In one prior art device, multiple inductive coils are positioned on the patient to move with respect to each other as the patient breathes. The mutual inductance between the coils changes with their relative motion and is measured to detect respiratory motion.

In a somewhat different design, respiratory deformation of a single coil causes a change of inductance in that coil which may be measured by the detuning of an oscillator using the coil's inductance as a tuning element. The change in frequency of the oscillator is used as a measure of respiratory motion.

With these electrical sensors, the sensing coil must be snugly fit to the patient so as to move with the patient and for this reason may create an unpleasant confining sensation or pressure on the patient's trunk and stomach. Such constraining pressure is particularly problematic with small infants. Such electronic sensors are unsuitable for measuring cardiac motion which does not result in significant distention of the patient's chest or abdomen.

SUMMARY OF THE INVENTION

The present invention provides a single-coil non-contacting conductance sensor that provides improved accuracy in conductance measurement. By driving the single coil at its resonant frequency (as coupled to the measured material) capacitive and inductive effects are minimized making the eddy current measurement more robust against the influence of the geometry of the measurement and qualities of the material other than its conductance.

Specifically, the sensor includes a conductive coil driven by an auto-tuning oscillator. The auto-tuning oscillator seeks a resonant frequency of the conductance coil as coupled to a measured material and its environment to induce eddy currents in the measured material. An impedance measuring circuit is connected to the conductive coil providing a measure of the effective resistance of the coil at the resonant frequency as reflects the magnitude of the induced eddy currents within the sample.

Thus, it is another object of the invention to provide a simplified conductance measuring sensor that is resistant to inductive and capacitive effects. By driving the coil at its natural resonant frequency, the resistive effects to be measured dominate.

The auto-tuning oscillator may include a gain controlled amplifier having a gain control input signal reflecting the amplitude of the signal driving the coil and the impedance measuring circuit may derive resistance from the gain control signal.

Thus it is another object of the invention to provide a conductance sensor that is resistant to amplitude dependent effects in the conductance measuring process.

The gain control signal may be provided by a synchronous rectifier, rectifying an oscillator signal from the oscillating current synchronously with the oscillating current. The synchronous rectifier may be a multiplier multiplying the oscillator signal by itself.

Thus it is another object of the invention to provide a conductance sensor that is resistant to asynchronous noise sources. The synchronous rectifier is not switched by larger amplitude out of phase or different frequency signals which will then be averaged out in a subsequent filtering stage.

One application of the conductance sensor is electronic monitoring of respiratory (or cardiac) motion which relies on the measurement of changes in conductivity in the patient's tissue within a limited cross-sectional area. Because the measurement does not rely on changes in the coil's dimensions, the sensor may be less constraining to the patient and more robust against deformation of the coil in use.

Specifically, the conductive coil is sized to fit about the body of a person. The auto-tuning oscillator, connected to the conductive coil, drives the coil with an oscillating current at a resonant frequency to induce eddy currents in the person. Attached to the conductive coil is the impedance measuring circuit which provides a measure of the effective resistance of the coil at the first frequency as reflects the magnitude of the induced eddy currents within the person. An electronic filter receiving this impedance signal extracts a periodic plethysmographic signal.

Thus, it is one object of the invention to provide a method of measuring periodic physiological motion, such as cardiac or respiratory motion, by detecting changes in areal conductance of patient tissue within a coil without the need to deform the coil in time with the physiological motion. Because the invention does not require outward distention of the patient, it is equally effective to measure periodic internal conductance changes, for example those caused by the heartbeat, as with those conductance changes which are reflected in outward movement of the patient, such as breathing.

The patient monitor may include two coils sized to fit about the body of the person, one in the abdominal area of the person and one in the thoracic area of the patient. Here, the impedance measuring circuit provides measures of the effective resistance of the two coils separately. An alarm may compare these separate resistance measurements to determine when distress of the person is indicated.

Thus, it is another object of the invention to provide an electronic respiratory detector that can provide separate measures of two different regions of the body in proximity to each other. Because only a single coil is needed to measure conductivity, multiple measurements may be made by adjacent multiple coils.

The foregoing and other objects and advantages of the invention will appear from the following description. In the description, reference is made to the accompanying drawings which form a part hereof and in which there is shown by way of illustration, a preferred embodiment of the invention. Such embodiment does not necessarily represent the full scope of the invention, however, and reference must be made therefore to the claims herein for interpreting the scope of the invention.

DETAILED DESCRIPTION OF THE PREFERRED EMBODIMENT

Belt Construction and Loop Placement

Figure 1:
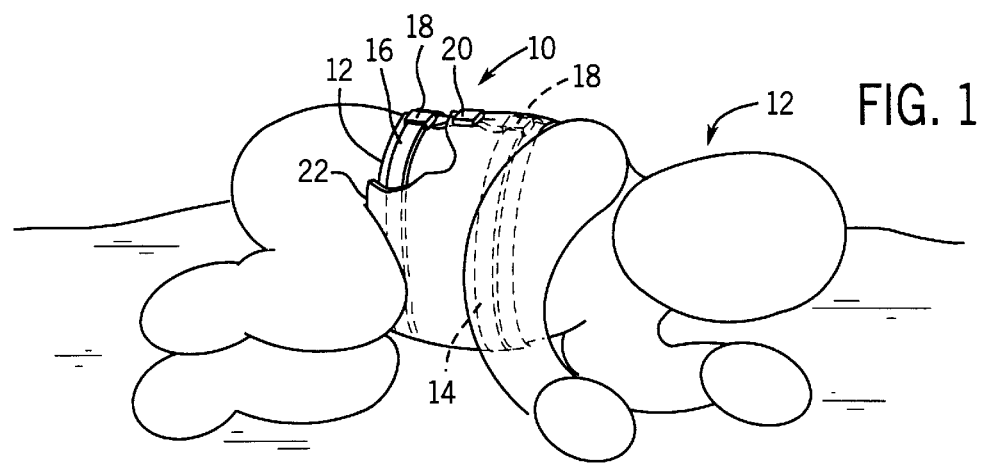
FIG. 1 is a perspective view of a belt incorporating the present invention and shown in position on an infant.

Referring to FIG. 1, the present invention may be incorporated into a belt 10 for wrapping about the trunk of a patient 12, such as an infant, with the upper edge of the belt being positioned about the patient's thoracic region and the lower edge of the belt being positioned about the patient's abdomen.

Figure 2:
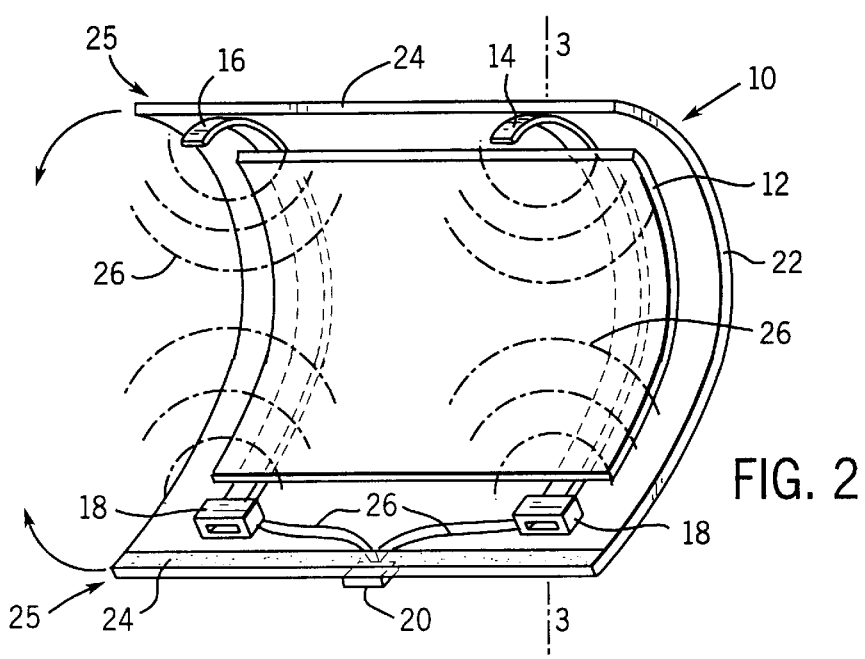
FIG. 2 is a perspective view of the belt of FIG. 1 when open showing the localization of the magnetic fields from two coils in the abdominal and thoracic region.

Referring also to FIG. 2, the belt 10 may include an inner fabric sleeve 12 providing electrical insulation and cushioning to the patient 12 against various rigid portions of the belt 10 as will be described.

Attached to the outside of the sleeve 12 near the superior and inferior edges of the belt 10 are first and second flexible electrical conductors 14 and 16 which open into a C-shaped form when the belt 10 is opened. Connectors 18, attached to one end of each of conductors 14 and 16, physically join together the ends of conductors 14 and 16, to form two loops, one about the thoracic and one about the abdominal regions of the patient 12 when the belt 10 is closed, as shown in FIG. 1. The opposing ends of each of the conductors 14 and 16 remain electrically isolated so that an oscillating electrical signal may be applied across the ends of conductor 14 and conductor 16.

The conductors 14 and 16 may be flat metal springs of a conductive material such as brass so as to open and close without permanent deformation.

An outer insulating fabric sleeve 22 covers the inner sleeve 12, sandwiching the conductors 14 and 16 between the inner sleeve 12 and the outer sleeve 22. Medial edges 25 of the outer sleeve 22 support opposite halves of a strip fastener 24, such as Velcro, so that the medial edges 25 may be removably attached to one another to close the belt 10 about the patient 12 and to resist outward forces which might serve to disconnect conductors 14 and 16 from connectors 18.

Additional circuitry 20 which includes two oscillators, to be described below, and a low powered radio transmitter to transmit signals from the patient 12, and a battery is connected to each of the connectors 18 and thus to both ends of each conductors 14 and 16 by wires 26 running along the inner surface of the outer sleeve 22 and passing through the outer sleeve 22 to the circuitry 20.

Conductivity Measurement with Eddy Currents

Figure 3:
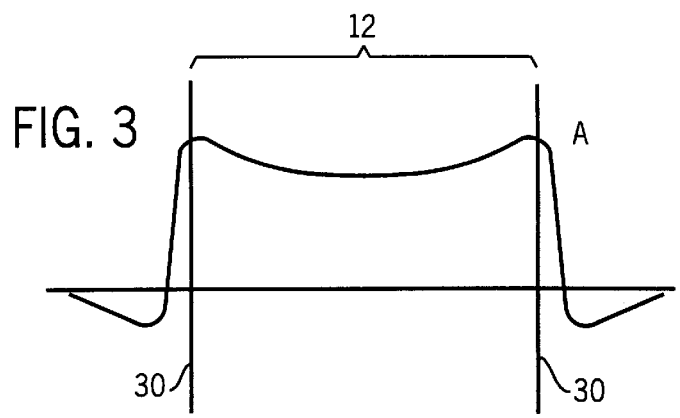
FIG. 3 is a plot of magnetic field strength versus distance along line 3—3 of FIG. 2 when the belt is closed.

Referring now also to FIG. 3, when the conductors 14 and 16 are formed into a loop with a closing of the belt about the patient 12, alternating current passing through the conductors 14 and 16 generates oscillating magnetic fields 26 within the patient 12. FIG. 3 shows the amplitude of magnetic fields along a transverse plane through the patient caused by current flow through conductors 14 and 16.

As shown in FIG. 3, the amplitude of the magnetic field A is concentrated within the patient 12 and of relatively low magnitude outside of the patient, the boundaries of which are indicated by vertical lines 30. The strength of the magnetic field falls off rapidly in a direction perpendicular to the plane of the coils of the conductors 14 and 16 and thus interference in the measurements obtained by the coils 14 and 16 is low.

The oscillating magnetic fields 26 will induce eddy currents within the patient 12, the magnitude of which are proportional to the conductivity of the tissue. For example, if the tissue of the patient 12 were perfectly conductive, the eddy currents would be sufficient to generate a magnetic field (back EMF) opposing the magnetic field 26 to perfectly cancel that magnetic field 26. On the other hand, to the extent that the tissue of the patient 12 is not perfectly conductive, the eddy fields will be lower, and the magnetic field 26 will be reduced but not canceled. Thus, a measurement of the back EMF created by the eddy currents within the patient provides an indication of the conductivity of the patient tissue.

Figure 4:
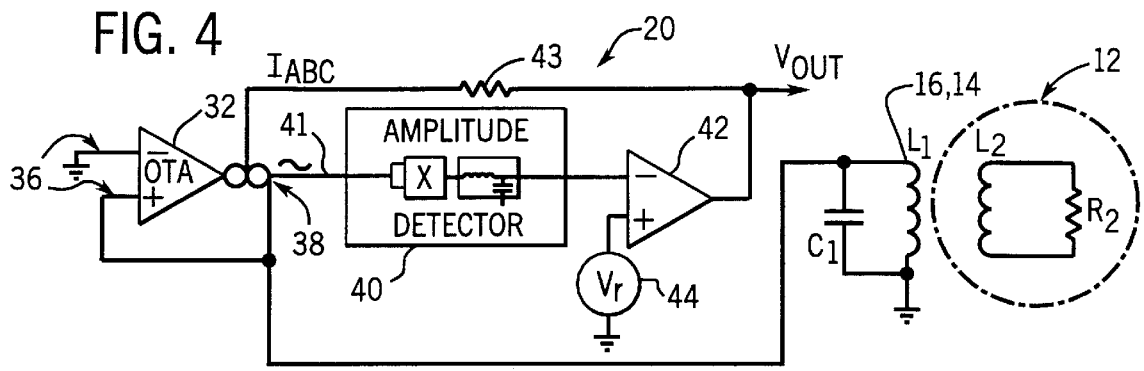
FIG. 4 is a schematic diagram of a circuit used to drive the coils of FIG. 2 and to provide a conductance measurement of the region of the magnetic fields shown in FIG. 2.

Referring now to FIG. 4, the effective circuit of a conductor 14 or 16 in proximity to the patient 12 may be modeled as a first inductor L1 (comprised of either conductor 14 or conductor 16), inductively coupled (as if in a transformer) to a second inductor L2, connected in series with a resistance R2. The inductor L2 and resistance R2 are not discrete elements, but are the equivalent lumped values incorporating the distributed inductance and resistance of many looping current paths of the eddy currents through tissue of the patient 12. Generally, however, $R_2$ will reflect a total conductivity (1/R) in the region within a given loop 14 and 16.

The Relationship Between Conductivity And Physiological Motion

This resistance $R_2$ in turn will depend generally on the real resistance, (W/cm$^2$), of the tissue in the area enclosed by the loop 14 or 16 times the area enclosed by the loop 14 or 16. For this reason, changes in the cross-sectional area of the patient 12 within either loop 14 or 16 will produce changes in the value of $R_2$ measured with that loop 14 or 16.

Further, changes in the cross-sectional area of an organ within the patient 12 and within the plane of a loop 14 or 16, and having a noticeably different areal resistance than the surrounding tissue will also be reflected in a change in the value of $R_2$. For this reason, the value of $R_2$ will show both respiratory motion in which the patient's overall cross-sectional area changes, and cardiac motion in which a relative area of highly conductive blood changes within the patient without significant overall change in the overall patient cross-sectional area.

Resistance Measuring Circuitry

The value of $R_2$ is detectable as a decrease in the quality factor of an oscillator employing conductor 14 or 16 as an inductive component of an oscillator tank circuit.

The oscillator is formed from the parallel combination of inductance :$L_1$ being one of conductor 16 or 14, and a capacitor $C_1$ contained within the electronics circuitry 20. In a preferred embodiment, $C_1$ is selected to tune the combination of $L_1$ and $C_1$ into parallel resonance at approximately 4.5 MHz. For conductors 14 and 16 formed into a loop having a diameter of approximately 100 millimeters, $C_1$ will be a capacitor of 330 pF.

As is known in the art, the quality factor of an oscillator provides a measure generally indicating how long an oscillator would continue to oscillate without the input of additional energy (free oscillation). Without eddy currents, the oscillator formed of conductors 14 or 16 would be expected to oscillate for a time limited only by the intrinsic resistance of the conductors 14 and 16 and the other components forming the oscillating resonant circuit. With eddy currents, the resulting back EMF adds an effective power dissipating resistance to the oscillator, shortening the time of free oscillation. Thus, a measure of the quality factor of oscillators formed from conductors 14 and 16 provides an indication of the conductivity of the patient 12.

The measurement of quality factor of a resonant circuit is well known in the art. However, in the present invention an extremely precise measurement is required and the measurement must be robust in the environment of a moving patient and in a situation where the value of $L_1$ may change from measurement-to-measurement based on some inadvertent deformation of the conductors 14 and 16, and in variations of attaching the belt 10 to the patient 12.

In order to improve the quality factor measurement, the measurement is made at the resonant frequency of the parallel combination of $C_1$ and $L_1$. In fact, the oscillator driving the loops 14 and 16 effectively tracks to the resonant frequency of the parallel combination of $C_1$ and $L_1$ as will be described. Thus the effect of variations in the resonant frequency of $L_1$ and $C_1$ with respect to the oscillator frequency, such as might effect the quality factor measurement, is reduced. It will be further understood that my driving the coil at resonant frequency, undesired capacitive and inductive influences on the measurement are reduced because the inductive components of the detected signal will cancel the capacitive components of that signal.

In addition, the amplitude of the oscillator driving the parallel combination of $L_1$ and $C_1$ is precisely controlled to a constant value. Thus, the effect of amplitude on the quality factor measurement is eliminated and apparent changes in quality factors such as might be caused by a slight detuning of the oscillator with respect to the inductive parallel combination of $L_1$ and $C_1$, are reduced.

In a preferred embodiment, an oscillator providing the desired feature of tracking the resonance of $C_1$ and $L_1$ and providing a constant amplitude oscillation is provided through the use of an operational transconductance amplifier (OTA) 32 connected at its output 38 to one junction between capacitor $C_1$ and inductor $L_1$. The remaining junction between $C_1$ and $L_1$ is connected to ground.

As is understood in the art, an operational transconductance amplifier provides a current at its output 38 that may be modeled as a gain factor $G_m$ times the voltage across inverting and non-inverting inputs 36 (indicated by a minus and plus sign, respectively) of the operational transconductance amplifier 32. The value $G_m$ is determined by an amplifier bias current $I_{abc}$.

The output 38 of the OTA 32 is also connected to the non-inverting input 36 of the OTA 32. In this positive feedback configuration, the output current of the OTA 32 will naturally oscillate at the resonant frequency of the parallel combination of $C_1$ and $L_1$ to produce an oscillator signal 41.

This oscillator signal 41 on output 38 is also received by an amplitude detector 40, which is a precision synchronous rectifier and low-pass filter providing a DC voltage proportional to the amplitude of the oscillator signal 41 at output 38. The synchronous rectifier is realized in the preferred embodiment by a multiplier that accepts at its two factor inputs the output 38. Any noise signal on output 38 that is asynchronous with the oscillator signal 41 will average to zero in the low pass filter. The output of the amplitude detector 42 is received by an inverting input of a standard high-gain operational amplifier 42, whose positive input receives a precision reference voltage 44 designated as $V_r$.

The amplifier 42 operates open-loop, and hence it will be understood that if the voltage on the inverting input of the amplifier 42 is greater than $V_r$, the output of amplifier 42 will be a negative value. On the other hand, if the voltage on the inverting input of the amplifier 42 is negative with respect to $V_r$, the output of amplifier 42 will be positive. The output of the amplifier 42, termed $V_{out}$, is applied to limiting resistor 43 to become amplifier bias current $I_{abc}$.

The connection of the output of the amplifier 40 to the OTA 32 provides feedback control of the amplitude of the oscillator signal 41 to the value of $V_r$. As connected in this manner, the value of $V_{out}$ being the amplitude error signal indicates generally how much additional energy must be input into the oscillator of $C_1$ and $L_1$ to maintain oscillation at the desired amplitude Of $V_r$ and thus provides a measure of the quality factor of the oscillator of $C_1$ and $L_1$ and hence a measure of $R_2$. Generally, the higher the value of $V_{out}$, the less the value of $R_2$.

Figure 5:
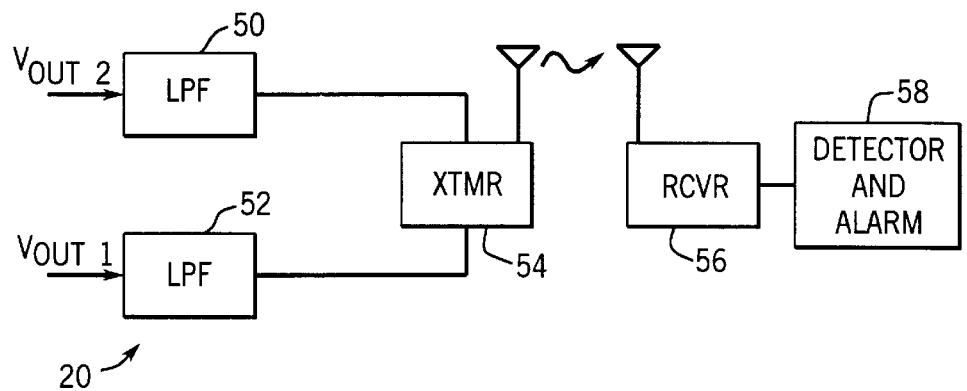
FIG. 5 is a block diagram showing subsequent processing of the conductance measurement.

Referring now to FIG. 5, the circuit of FIG. 4 is repeated once for each of the conductors 14 and 16 and hence two values of $V_{out}$ will be obtained, each indicating the conductivity of the patient within the area encircled by respective loops 14 and 16. These two signals distinguished as $V_{out2}$ (referring to the signal from coil 16 and from the abdomen) and $V_{out1}$ (referring to the signal from coil 14 and from the thoracic region), are each received by separate low-pass filters 50 and 52, respectively, which are tuned to reject the fundamental frequency of the oscillator signal 42 driving the loops 14 and 16, but to pass lower frequency signals caused by a slowly varying change in the value of $R_2$ with respiration or cardiac motion. In the following discussion, it will be assumed that the frequency of the low-pass filters 50 and 52 is adjusted to extract respiratory motion such as may be needed to diagnose sleep apnea.

The signals from the low-pass filters 50 and 52 are then provided to a low-powered radio transmitter 54 contained within the circuitry 20 shown with respect to FIG. 2. A nearby receiver 56 receiving this signal extracts two respiratory signals. The transmitter and receiver circuits 54 and 56 are constructed according to techniques wellknown in the art, and may be a simple low-power FM link with a different frequency assigned to each of the different respiratory signals.

The receiver 54 provides the respiratory signals to a detector and alarm circuit 58, which is programmed to detect patient distress. The detector and alarm circuit 58 may provide an alarm indicating a loss of respiratory signal extending for more than a certain period of time. Alternatively, or in addition, the alarm and detector circuit 58 may detect a loss of phase coherence between the signals $V_{out1}$ and $V_{out2}$ such as may indicate obstructive apnea as described before. The detector and alarm 58, in a preferred embodiment, are a microprocessor programmed to receive digitized samples of the respiratory signals and to monitor them according to the criteria described above or other criteria that may be selected by a physician.

It will be recognized that this approach of detecting cardiac and respiratory signals through a measurement of changes in conductivity does not require that the loops 14 and 16 be deformed or flexed with motion of the patient 12, and in fact, the circuit would work if loops 14 and 16 were perfectly rigid and unyielding. As a result, the patient 12 is not unduly compressed about the torso by pressure by the belt 10 other than that minimally necessary to hold the belt 10 in position.

Figure 6:
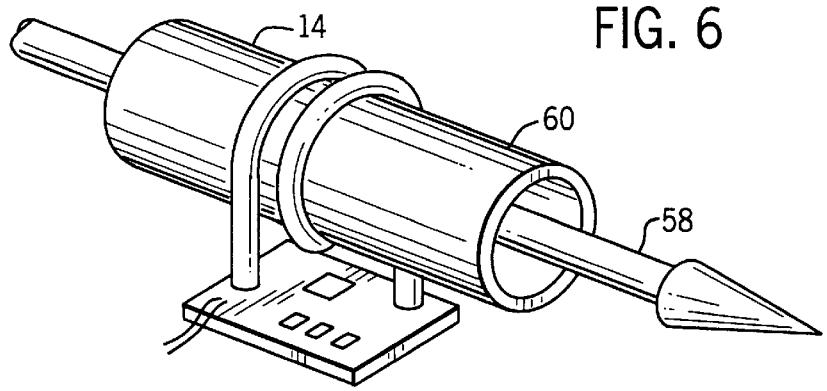
FIG. 6 is a perspective view of a general-purpose conductance sensor employing the principle of the present invention.

Referring now to FIG. 6, the above-described circuit may also find use in measuring the conductivity of an arbitrary material, such as a liquid 58 passing through a pipe 60. Here a single conductor 14 is used passing in one or more loops about the circumference of the tube 60 so as to again generate an internal oscillating magnetic field (not shown) inside the tube 60. The back EMF of the eddy currents so induced is detected by measuring the quality factor of an oscillator formed of the conductor and a parallel capacitor (not shown) as described above.

Unlike other conductance sensors in the prior art, no direct contact is required between the liquid 58 and one or more electrodes of the circuit, nor is it necessary that the loop 14 be immersed in the liquid 58 such as may produce clogging or unnecessary turbulence, or that the loop 14 be used in conjunction with a second loop 16.

The measurement of conductivity in this manner may provide an indication of the composition of the liquid 58 and may detect inclusions such as air bubbles or the like.

The liquid 58 need not fill the tube 60, however. To the extent that the liquid 58 occupies only a portion of the cross-sectional area excited by the coil 14, the conductivity will look proportionately lower.

Many other modifications and variations of the preferred embodiment which will still be within the spirit and scope of the invention will be apparent to those with ordinary skill in the art. For example, the conductance probe may be used over a large volume and thus as a means of detecting the presence of people in a room. On a smaller scale the conductance sensor may be used to detect nearby high or low conductance materials including metal and thus function as a proximity switch. In order to apprise the public of the various embodiments that may fall within the scope of the invention, the following claims are made.

We claim:

1. A method of quantitative measurement of the resistance of a remote substance using a single coil comprising the steps of:
    (a) exciting the coil with an electrical signal to produce an electromagnetic field enveloping the remote substance;
    (b) allowing the frequency of the electric signal to be at the resonant frequency of the coil as affected by the remote substance;
    (c) adjusting a control signal controlling the amplitude of the electrical signal so that the electric signal at the coil substantially equals a predetermined standard level; and
    (d) deriving a resistance value of the remote substance based on the adjusted control signal independent of any deformation of the coil, wherein the resistance value of the remote substance is only substantially indicative of a real portion of an impedance of the remote substance and is not substantially indicative of any reactance or inductance of the remote substance or the coil.

2. The method of claim 1 wherein the remote substance is a liquid and including the step of flowing the liquid through a tube positioned in the electromagnetic field.

3. The method of claim 1 wherein step (b) is performed by an amplifier having positive feedback from the coil.

4. The method of claim 1 wherein step (c) is performed using a rectifier receiving the electric signal from the coil and rectifying the electric signal synchronously with the phase of the electric signal.

5. The method of claim 4 wherein step (c) is performed by multiplying the electric signal by itself.

6. A sensor for remote measurement of resistance of a sample material comprising:
    a conductive coil;
    an oscillator connected to the conductive coil to:
        (1) drive the conductive coil with an oscillating current;
        (2) to receive feedback from the conductive coil to allow the frequency of the oscillating current to be at a varying resonant frequency of the conductive coil as coupled to the sample; and an amplitude control circuit connected to the oscillator to adjust the oscillating current; and an output providing an error signal indicating the adjustment of the amplitude control circuit, the error signal providing a measure of the effective resistance of the sample, wherein the measure of the effective resistance of the sample can be determined independent of any deformation of the conductive coil, and wherein the effective resistance of the sample is only substantially indicative of a real portion of an impedance of the sample and is not substantially indicative of any reactance or inductance of the sample or the conductive coil.

7. The sensor of claim 6 wherein the oscillator is an amplifier having an output connected to the coil and configured for positive feedback.

8. The sensor of claim 6 wherein the oscillator includes a gain controlled amplifier having a gain control input signal reflecting the voltage amplitude of the oscillating current; and wherein the error signal is the gain control input.

9. The sensor of claim 8 wherein the gain control input is provided by a rectifier, rectifying the oscillating current synchronously with the oscillating current.

10. The sensor of claim 9 wherein the rectifier is a multiplier multiplying the oscillating current by itself.

11. The sensor of claim 6 including a guide for positioning the measured material in a predetermined relationship with respect to the coil.

12. The sensor of claim 6 wherein the guide is a non-conductive tube through which a liquid may pass.

* * * * *